(12) United States Patent
Stone et al.

(10) Patent No.: US 10,385,454 B2
(45) Date of Patent: *Aug. 20, 2019

(54) DIFFUSION RESISTANT ELECTROSTATIC CLAMP

(71) Applicants: Varian Semiconductor Equipment Associates, Inc., Gloucester, MA (US); Entegris, Inc., Billerica, MA (US)

(72) Inventors: Dale K. Stone, Lynnfield, MA (US); Richard Cooke, Framingham, MA (US); I-Kuan Lin, Lexington, MA (US); Julian G. Blake, Gloucester, MA (US); Lyudmila Stone, Lynnfield, MA (US)

(73) Assignees: Varian Semiconductor Equipment Associates, Inc., Gloucester, MA (US); Entegris, Inc., Billerica, MA (US)

( * ) Notice: Subject to any disclaimer, the term of this patent is extended or adjusted under 35 U.S.C. 154(b) by 74 days.

This patent is subject to a terminal disclaimer.

(21) Appl. No.: 15/448,838

(22) Filed: Mar. 3, 2017

(65) Prior Publication Data

US 2017/0335460 A1 Nov. 23, 2017

Related U.S. Application Data

(63) Continuation of application No. 14/280,245, filed on May 16, 2014, now Pat. No. 9,644,269.

(60) Provisional application No. 61/933,659, filed on Jan. 30, 2014.

(51) Int. Cl.
*C23C 16/50* (2006.01)
*H01L 21/683* (2006.01)
*H02N 13/00* (2006.01)
*C23C 28/04* (2006.01)

(52) U.S. Cl.
CPC ............ *C23C 16/50* (2013.01); *C23C 28/042* (2013.01); *C23C 28/044* (2013.01); *H01L 21/6831* (2013.01); *H02N 13/00* (2013.01)

(58) Field of Classification Search
CPC ..... C23C 16/50; C23C 28/044; C23C 28/042; H01L 21/6831; H02N 13/00
USPC ............................... 361/234; 427/126.4, 576
See application file for complete search history.

(56) References Cited

U.S. PATENT DOCUMENTS

| 5,566,043 | A | 10/1996 | Kawada et al. |
| 7,446,284 | B2 | 11/2008 | Fan et al. |
| 9,543,187 | B2 | 1/2017 | Cooke |
| 9,644,269 | B2 * | 5/2017 | Stone ...................... C23C 16/50 |
| 2003/0102880 | A1 | 6/2003 | Kanamaru et al. |
| 2007/0146961 | A1 | 6/2007 | Morioka et al. |
| 2009/0161285 | A1 | 6/2009 | Abouaf et al. |

(Continued)

FOREIGN PATENT DOCUMENTS

| JP | H08288376 A | 11/1996 |
| JP | H11-135602 | 5/1999 |
| JP | 2000-216232 | 8/2000 |

(Continued)

*Primary Examiner* — Hrayr A Sayadian
(74) *Attorney, Agent, or Firm* — Diederiks & Whitelaw, PLC.

(57) ABSTRACT

In one embodiment, a method of fabricating an electrostatic clamp includes forming an insulator body, forming an electrode on the insulator body, and depositing a layer stack on the electrode, the layer stack comprising an aluminum oxide layer that is deposited using atomic layer deposition (ALD).

17 Claims, 8 Drawing Sheets

(56) References Cited

U.S. PATENT DOCUMENTS

2010/0103584 A1    4/2010   Nam
2012/0199469 A1    8/2012   Rasheed et al.

FOREIGN PATENT DOCUMENTS

| | | |
|---|---|---|
| JP | 2004-296536 | 10/2004 |
| JP | 2005093723 A | 4/2005 |
| JP | 2007-210825 | 8/2007 |
| JP | 2009-071223 | 4/2009 |
| TW | 200737400 A | 10/2007 |
| TW | 200741938 A | 11/2007 |

\* cited by examiner

| DIFFUSION BARRIER TEST MATRIX | | | | |
| --- | --- | --- | --- | --- |
| APPROX 1 X 1 SAMPLES OF GLASS DIELECTRIC SUBSTRATE | | | | |
| | ALD $Al_2O_3$ 200 nm | ALD $Ta_2O_5$ 200 nm | PECVD SiN 200 nm | PECVD SiN 2 microns |
| FIG. 4A | X | | | |
| FIG. 4B | | X | | |
| FIG. 4C | | | X | |
| FIG. 4D | | | | X |
| FIG. 4E | X | | | X |
| FIG. 4F | | X | | X |
| FIG. 4G | X | X | | X |
| FIG. 4H | NO COATINGS - REFERENCE SAMPLE | | | |
| FIG. 4I | X | X | | |

DIFFUSION RESISTANT ELECTROSTATIC CLAMP

RELATED APPLICATIONS

This application is a continuation of U.S. patent application Ser. No. 14/280,245, filed May 16, 2014, which claims priority to U.S. Provisional Patent Application No. 61/933,659, filed Jan. 30, 2014, both of which applications are hereby incorporated by reference herein.

FIELD

The present embodiments relate to substrate processing, and more particularly, to electrostatic clamps for holding substrates.

BACKGROUND

Substrate holders such as electrostatic clamps are used widely for many manufacturing processes including semiconductor manufacturing, solar cell manufacturing, and processing of other components. Many substrate holders provide for substrate heating as well as substrate cooling in order to process a substrate at a desired temperature. Electrostatic clamps exhibit multiple different failure mechanisms when operated at elevated temperature, such as 400° C. or higher. For one, undesirable metal contamination may occur when metallic elements that are present in a dielectric portion of the electrostatic clamp are leached from the dielectric portion and enter an adjacent substrate, such as a semiconductor wafer.

Another failure mechanism involves electromigration when the metal material within a clamping electrode of the electrostatic clamp becomes mobile. This may lead to an increase in clamp current, and ultimately cause the clamping force that is applied to a substrate to decrease.

It is with respect to these and other considerations that the present improvements have been needed.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one embodiment, a method of fabricating an electrostatic clamp includes forming an insulator body, forming an electrode on the insulator body, and depositing a layer stack on the electrode, the layer stack comprising an aluminum oxide layer that is deposited using atomic layer deposition (ALD).

In another embodiment, an electrostatic clamp may include an insulator body, an electrode disposed on the insulator body, and a layer stack comprising an amorphous aluminum oxide layer having a thickness of 10 micrometers or less and at least one additional insulator layer.

In a further embodiment, an electrostatic clamp system may include an insulator body, an electrode comprising a metallic material that is disposed on the insulator body, a layer stack comprising insulating material having a total thickness of less than 100 micrometers, and including an amorphous aluminum oxide layer having a thickness of 10 micrometers or less; and a heater configured to heat the insulator body, wherein the electrostatic clamp is configured to operate at 500° C. or greater without diffusion of the metallic material through the layer stack.

DETAILED DESCRIPTION

The present embodiments provide a diffusion resistant electrostatic clamp that addresses multiple issues found in present day electrostatic clamps. In the present embodiments, a diffusion resistant layer stack is provided between an electrode of an electrostatic clamp and a substrate to be held by the electrostatic clamp. The diffusion resistant layer stack may suppress leaching of metal from the electrostatic clamp during operation, which could otherwise contaminate the substrate. The diffusion resistant layer stack may also prevent a decrease in clamping force of an electrostatic clamp that may take place due to electromigration induced in a clamping metal electrode during operation.

In various embodiments, a layer stack that is diffusion resistant may be at least one layer, and in particular embodiments the layer stack is made from multiple layers. The layer stack may be electrically insulating in order to support the generation of an electric field between electrostatic clamp and substrate. In some embodiments, each layer of the layer stack is electrically insulating. In some embodiments, at least one layer of the layer stack may be formed by atomic layer deposition (ALD). The at least one layer that is formed by atomic layer deposition ("ALD layer") may provide enhanced diffusion resistance to metals that may be present in the electrostatic clamp. Suitable material for a diffusion resistant ALD layer consistent with the present embodiments includes aluminum oxide ($Al_2O_3$).

Atomic layer deposition (ALD) is a deposition method that is related to chemical vapor deposition (CVD). In ALD, multiple separate reactions (such as half-cycles in the case of two separate reactions) using separate precursors are conducted sequentially to complete a single full deposition cycle that deposits a fixed amount of material. During deposition of a binary compound such as aluminum oxide the layer to be formed is deposited by the repetition of two different half-cycles. After each half-cycle, a fixed amount of reactive species supplied by a first precursor remains on the substrate surface. Ideally, though not necessarily, a single monolayer of a first species may be produced after a first half cycle. Each species of the monolayer of first species may be reacted with species of the second precursor supplied in the next half cycle. In each half-cycle, subsequent to supplying the reactive species, a purge can be performed to remove any unreacted species of the depositing material. The total amount of material reacted in a cycle may thus be equivalent to a monolayer of each reactant. In this manner, each cycle may produce the same amount of material as any other cycle. Thus, within a wide process window, the total thickness of a layer merely depends on the number of cycles performed. Moreover, the microstructure of such a layer may be characterized by alternating monolayers of component material, such as layer A, layer B, layer A, layer B, and so forth.

Figure 1:
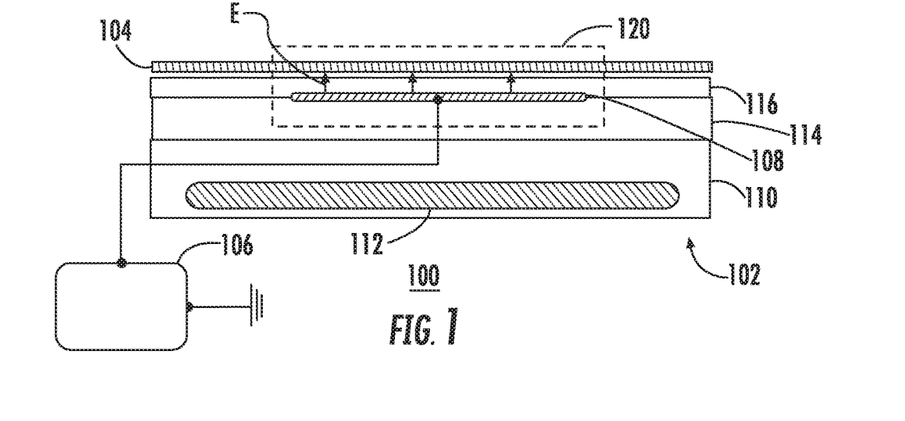
FIG. 1 depicts an electrostatic clamp system according to embodiments of the disclosure.

Turning now to the figures, in FIG. 1 there is shown an electrostatic clamp system 100 arranged in accordance with embodiments of the disclosure. The electrostatic clamp system 100 includes an electrostatic clamp 102 to support and hold a substrate 104 for processing. The electrostatic clamp system 100 includes a voltage supply 106 that is configured to apply a voltage to an electrode 108. As a consequence, an electric field E is generated that may clamp the substrate 104. Although the electrostatic clamp 102 is illustrated as having a single electrode, the electrostatic clamp 102 may include multiple electrodes in some embodiments, and may operate as in conventional electrostatic clamps with DC voltage or AC voltage in different embodiments.

The electrostatic clamp 102 includes a base 110, which may be a metal material in some embodiments. In various embodiments, the base 110 may include a heater 112. The heater 112 is designed to heat the electrostatic clamp 102 and thus the substrate 104 during processing. In some embodiments, the heater may be designed to generate a substrate temperature of 400° C. or greater, 500° C. or greater such as 600° C., or 800° C. In other embodiments, the electrostatic clamp 102 may be heated by a heater that is external to the electrostatic clamp or attached to the electrostatic clamp.

Although not depicted in FIG. 1, the electrostatic clamp system 100 may include a gas source that delivers gas to a gas distribution system (not shown) within the electrostatic clamp 102 to provide heat conduction between the substrate 104 and electrostatic clamp, as in conventional electrostatic clamps.

The electrostatic clamp 102 also includes an insulator body 114 adjacent the base. In some embodiments, the insulator body is fabricated from alumina. Disposed on at least a portion of the insulator body 114 is a layer stack 116, which may include at least one insulator layer. The layer stack may also cover the electrode 108 such that the electrode 108 is disposed between the insulator body 114 and layer stack 116 as shown. During operation of the electrostatic clamp system 100, the combination of electric field E generated by the electrode 108 and high temperature generated by the heater 112 may exert a force that urges diffusion of metal species from the electrode 108. In order to prevent or lower this migration of metal species, the layer stack 116 includes at least one layer that provides enhanced diffusion resistance. In particular embodiments as discussed below, the at least one layer is formed by atomic layer deposition.

Figure 2A:
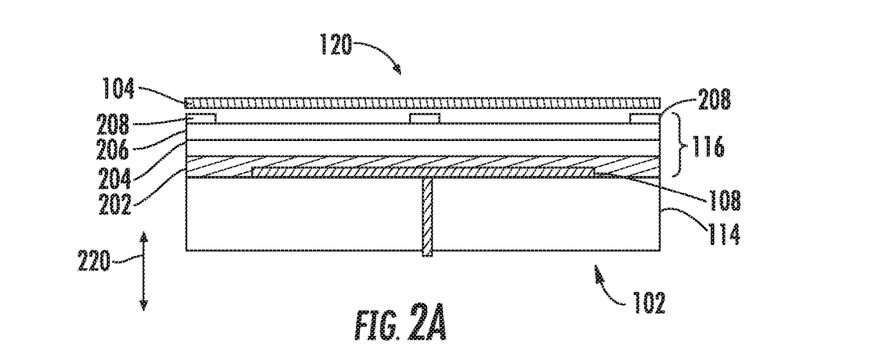
FIG. 2A depicts a side cross sectional view of a portion of an assembled electrostatic clamp according to various embodiments of the disclosure.

FIG. 2A depicts a close-up view of a portion 120 of the electrostatic clamp 102 according to one embodiment. In this embodiment, the layer stack 116 includes multiple layers. As illustrated a layer 202 is disposed on the electrode 108 and a portion of the insulator body 114. An additional layer, layer 204, is disposed on the layer 202, while a further layer, layer 206 is disposed on the layer 206 and is adjacent the substrate 104. Surface features 208 may be formed on the layer 206, which may act to support the substrate 104 and may further define regions in which backside gas may be provided between the substrate 104 and electrostatic clamp 102.

In various embodiments the layer 202, layer 204, and layer 206 are insulators. In some embodiments, the layer 202 is formed by ALD and provides enhanced resistance to diffusion of material from the electrode 108 as compared to conventional electrostatic clamps. In particular embodiments, the layer 202 is formed by ALD while the layer 204 and the layer 206 are formed by other processes, such as physical vapor deposition (PVD), chemical vapor deposition (CVD), or plasma enhanced chemical vapor deposition (PECVD). However, the embodiments are not limited in this context. In some embodiments, the total thickness of the layer stack 116 may be 40 micrometers to 200 micrometers.

In some embodiments the layer 202 is an $Al_2O_3$ layer that is formed by ALD. In particular, layer 202 may be an $Al_2O_3$ layer (also referred to herein as "aluminum oxide") having a thickness in the range of 0.5 micrometers (500 nanometers) to 10 micrometers. In various embodiments, the aluminum oxide layer formed by ALD may be an amorphous layer as deposited. As noted, a characteristic of an amorphous aluminum oxide layer formed by ALD may include a pinhole-free microstructure that is resistant to diffusion of species through the layer. Moreover, the aluminum oxide layer may remain amorphous at use temperatures commonly employed for electrostatic clamps, such as 800° C. or below. The embodiments are not limited in this context. In some embodiments, a further feature of an $Al_2O_3$ layer that is formed by ALD is the absence of additional elements other than aluminum and oxygen within the $Al_2O_3$ layer, which additional elements may be found in $Al_2O_3$ layers grown by other techniques such as conventional chemical vapor deposition or physical vapor deposition.

In the electrostatic clamp 102, an embodiment of the layer 202 that is composed of an $Al_2O_3$ material formed by ALD may serve multiple purposes. In the first instance, the layer 202 may act as a diffusion barrier to prevent the out-diffusion of the underlying metal from electrode 108. Secondly, the layer 202 may act as a high dielectric strength coating that provides a substantial portion of the voltage standoff needed for a dielectric to properly perform in an electrostatic clamp application. In some implementations, a voltage supply, such as the voltage supply 106, may generate a voltage of 200 to 1000 volts on the electrode 108 (as well as other electrodes that are not shown). As illustrated, the (dielectric) layer stack 116 is interposed between the electrode 108, which may be at 1000 V potential, and the substrate 104. The dielectric strength for ALD deposited $Al_2O_3$ has been reported as high as 1000 V per micrometer. Accordingly, in embodiments in which the thickness of the ALD-deposited $Al_2O_3$ layer, layer 202, is 1 micrometer or more, the layer 202 may provide sufficient resistance to dielectric breakdown for voltages up to 1000 V, even without consideration of the dielectric strength of the layer 204 and layer 206, whose total thickness may range up to 150 to 200 micrometers.

In additional embodiments the layer 202 is an $Al_2O_3$ layer that is formed by ALD, while the layer 204 is an aluminum oxynitride (ALON) layer formed by PVD, and the layer 206 is a silicon nitride layer formed by PECVD. In other embodiments, the layer 204 and layer 206, which may be ALON layer formed by PVD and silicon nitride formed by PECVD, respectively, may be repeatedly deposited to form a sequence of layers, layer 204, layer, 206, layer 204, layer 206, and so forth. In other words, the layer 204, which may be an aluminum oxynitride layer, and the layer 206, which may be a silicon nitride layer, may be deemed to be an overlayer stack that is formed on the layer 202. This overlayer stack may then be deposited at least two times to build up a total thickness of the layer stack to a desired amount. This may be useful to build up a total thickness of the layer stack 116 to 100-200 micrometers, where the thickness of each individual layer is much less, such as on the order of one micrometer or ten. The embodiments are not limited in this context. The use of PVD ALON may add dielectric thickness to increase the overall dielectric strength of the layer stack 116 while maintaining a high dielectric constant, such as above a value of 9. In addition, the use of PVD ALON may maintain high purity (>99.95%). The use of a silicon nitride layer may provide a contact surface that is patternable by dry-etch processing, thus facilitating creation of embossments as illustrated by surface features 208, as well as other features (not shown) that may act as gas seals when the substrate 104 is attracted to the electrostatic clamp 102. In addition, the use of silicon nitride layer, such as PECVD silicon nitride, provides an ultra high purity surface (>99.995%) that faces the substrate 104.

In additional embodiments, instead of multiple layers, a single insulator layer may be arranged on top of the layer 202. For example, in one embodiment, a single insulator layer having a thickness of less than 100 micrometers may be disposed on the layer 202, which is composed of aluminum oxide formed by ALD and has a thickness of 1 micrometer. In further embodiments, the layer 202, may be composed of aluminum oxide formed by ALD that has a thickness of 1 micrometer, and may be arranged as the outermost layer adjacent the substrate 104, while at least one insulator layer is disposed between the layer 202 and electrode 108. For example, the at least one insulator layer may have a thickness of 50 to 200 micrometers and may be composed of any conventional insulator material used in electrostatic clamps. An advantage of this configuration, is that the layer 202 may be effective to prevent diffusion of unwanted species not merely from the electrode 108, but also to prevent diffusion from conventional insulator material used to form the majority of thickness of the insulator layers of the electrostatic clamp above the electrode.

Figure 2B:
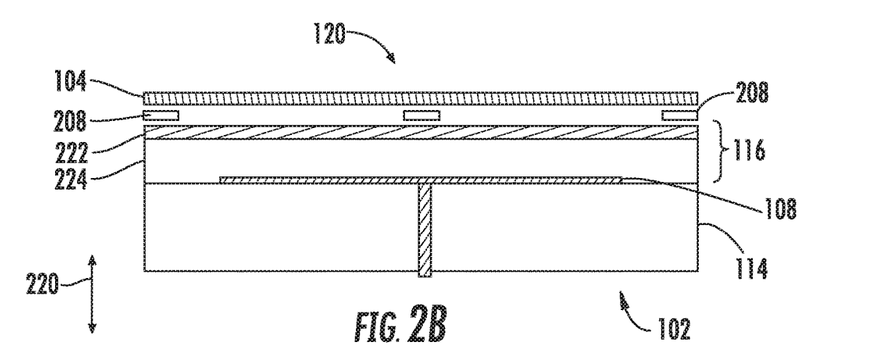
FIG. 2B depicts a side cross sectional view of a portion of an assembled electrostatic clamp according to various additional embodiments of the disclosure.

In some embodiments, the layer stack 116 may facilitate operation of the electrostatic clamp 102 under lower voltage conditions and under lower dielectric strength conditions than conventional electrostatic clamps that employ a monolithic dielectric material. For instance, in particular embodiments of electrostatic clamp 102, the layer stack 116 may have a thickness of 75 micrometers or less, such as a thickness of between 40 and 75 micrometers, and the electrostatic clamp 102 may operate under an applied voltage from voltage supply 106 of less than 500 V AC. FIG. 2B shows one variant of the electrostatic clamp 102 in which the layer stack 116 is composed of a layer of amorphous aluminum oxide, shown as layer 222. The layer 222 is disposed on top of an overlayer stack 224, which is formed directly upon the electrode 108. The layer 222 may be formed, for example, by ALD and may have a thickness of 0.5 micrometers to 5 micrometers in some instances. The embodiments are not limited in this context. The overlayer stack 224 is an insulator that may be composed of more than one layer of insulator material other than aluminum oxide, such as silicon nitride or aluminum oxynitride. The overlayer stack 224 may be deposited by chemical vapor deposition, physical vapor deposition, plasma enhance physical vapor deposition, or other technique. In one particular example the thickness of the layer 222 may range from one micrometer to two micrometers. Given this range of thickness and given that the layer 222 may be formed from aluminum oxide that is deposited by ALD, the layer 222 may resist breakdown until at least 1000 V is applied across the layer 222. In this example the presence of the overlayer stack 224 may impart further resistance to breakdown such that the layer stack 116 does not breakdown until greater than 1000 V is applied across the layer stack 116. An advantage of providing a one micron thick layer of aluminum oxide using ALD is that the electrostatic clamp 102 may be operated at voltages up to 1000 V of more without having to form an excessively thick layer stack. For example, it the overlayer stack 224 is composed of aluminum oxynitride or silicon nitride or a combination of the two, layer stack 116 may be formed having a total thickness of less than 100 micrometers, such as 40 to 75 micrometers. This total thickness may be sufficient to generate needed capacitance for proper clamping of substrates while at the same time providing resistance to dielectric breakdown for voltages up to 1000 V or more. At the same time these electrostatic clamp properties may be realized without having to deposit an excessively thick layer using ALD, which process may entail a relatively greater time and cost to deposit a given layer thickness in comparison to conventional physical vapor deposition or chemical vapor deposition processes.

In further embodiments, the electrode 108 may be formed by ALD, and in particular embodiments may be a platinum electrode (Pt). Such an electrode may provide an electrode layer that is compatible with operation of the electrostatic clamp 102 at high temperature, as well as providing a via conduction to a back side of the insulator body 114, which may be alumina in some embodiments.

The embodiments that are exemplified by FIG. 2A and FIG. 2B differ from conventional electrostatic clamps, which often are fabricated by forming an insulating layer on an electrode either by bonding a solid insulator to the electrode or by depositing a plasma sprayed layer over the electrode. However, these methods of fabricating an insulating layer may result in an electrostatic clamp structure that provides inadequate resistance to diffusion of the electrode metal material, especially when the electrostatic clamp is operated at elevated temperatures, such as at 400° C. or above. This may be a result of defects or other non-ideal features in such materials, which may lead to diffusion through such insulating layer as formed in conventional electrostatic clamps.

In contrast, the present inventors have discovered that the use of an ALD-deposited $Al_2O_3$ layer as a cover layer of an electrode in an electrostatic clamp greatly improves diffusion barrier properties as compared to conventionally deposited layers. In different embodiments, the ALD-deposited $Al_2O_3$ layer may be deposited directly on clamp electrodes, which may suppress out-diffusion of species from the electrodes, or may be deposited on top of an insulator layer(s)

that is itself formed directly on the clamp electrodes. In the latter case, the ALD-deposited $Al_2O_3$ may suppress out-diffusion of metal or other contaminants that may be present in the insulator layer(s) as well suppressing out-diffusion from electrode species.

In particular, such ALD-deposited $Al_2O_3$ layers have been observed to be free of defects and thinned areas leading to diffusion barrier properties up to several orders of magnitude better than conventionally deposited layers. For example, the present inventors have discovered that in electrostatic clamps where the electrode is covered with an $Al_2O_3$ layer that is fabricated using ALD, the metal contamination including Zn, Cu, and Pb has been reduced by approximately three orders of magnitude compared to an electrostatic clamp fabricated without diffusion barrier. Moreover, metal contamination is reduced by two orders of magnitude compared to electrostatic clamps where the electrode is covered with other deposited diffusion barrier layers such as $Si_3N_4$, $SiO_2$, etc, where such layers are deposited by conventional thin film deposition techniques as discussed above.

Accordingly, various embodiments may employ an amorphous alumina layer deposited by ALD to facilitate high temperature operation of an electrostatic clamp. In particular, the amorphous alumina layer may be disposed in a layer stack between an electrode and a clamping surface of the electrostatic clamp such that the electrostatic clamp can be operated at 500° C. or greater without diffusion of metallic material of the electrode through the layer stack. As noted above, such diffusion may lead to contamination of substrates being held by the electrostatic clamp and may additionally lead to degradation of the clamping properties such as clamping force that can be exerted by the electrostatic clamp, as well as the dielectric strength of the layer stack.

In order to study effectiveness of an $Al_2O_3$ layer that is fabricated using ALD on preventing diffusion of metal contaminants, a series of different candidate diffusion barrier layer stacks were deposited upon glass insulator substrates. The glasss insulator substrates were mad of known insulator material that may be found in conventional electrostatic clamps. The glass insulator substrates were found to have low levels of copper and iron impurities having concentrations in the range of $1E17/cm^3$ to $1E18/cm^3$. The diffusion barrier layer stacks that were deposited on the glass insulator substrates contained at least one layer that included different combinations of: a 200-300 nm thick layer of $Al_2O_3$ fabricated using ALD, a 200 nm thick layer of $Ta_2O_5$ fabricated using ALD, and a 200 nm or 2 micrometer thick layer of silicon nitride fabricated by PECVD. In all layer stacks that had an $Al_2O_3$ layer, the $Al_2O_3$ layer was formed adjacent the substrate, while in all layer stacks that had the silicon nitride layer, the silicon nitride layer was the outermost layer forming an interface with air.

Figure 3:
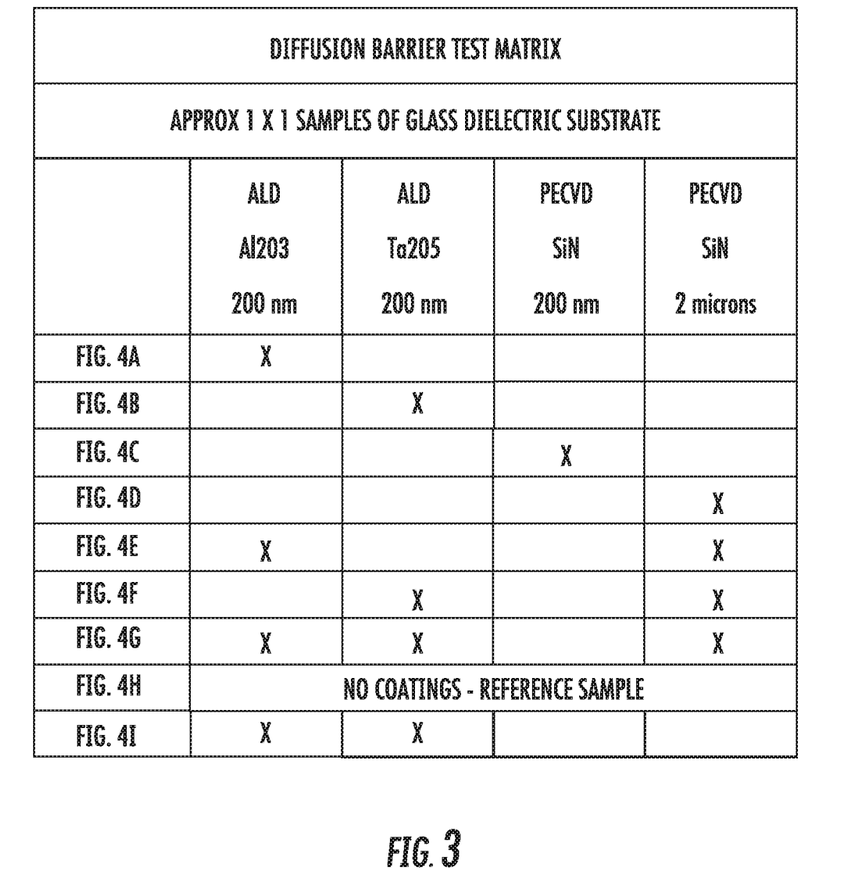
FIG. 3 depicts a matrix of experiments that illustrate operation of diffusion barrier layers according to various embodiments.

FIG. 3 presents an overview of the matrix of diffusion barrier layers stacks that were formed in this manner. Compositional analysis was performed after fabrication of the layer stacks on the glass substrates and treatment of the layer stacks by heating for 24 hrs at 550° C. The compositional analysis was performed by secondary ion mass spectrometry (SIMS), which is a technique that performs compositional profiling of different elements within an object as a function of depth from the surface of the object, where the object may be a substrate, a layer, or a group of layers.

The results of the SIMS analysis are shown in FIGS. 4A to FIG. 4I and may be summarized as follows. Notably, although the nominal thickness of the tantalum oxide and aluminum oxide layers was 200 nm, the results of SIMS analysis suggest that each of these layers had a thickness closer to 300 nm. However, such layers may nevertheless be referred to as "200 nm thick" as in FIG. 3, or as "nominally 200 nm thick" in the discussion to follow. When layer stacks were fabricated that included an $Al_2O_3$ layer formed by ALD, with or without additional layers, copper and iron diffusion were suppressed. In other words, the amount of copper or iron signal in the layer stack was greatly reduced as compared to that in the underlying substrate. When an ALD $Al_2O_3$ layer was not present in a layer stack, a 2 micrometer thick silicon nitride layer was effective in suppressing iron diffusion but not copper diffusion, such that copper concentration in the silicon nitride layer was comparable to that in the substrate. The use of a single nominally 200 nm thick layer of $Ta_2O_5$ fabricated using ALD was not effective in suppressing copper or iron diffusion. Nor was a bilayer of 2 micrometer thick silicon nitride layer and 200 nm thick layer of $Ta_2O_5$ effective in suppressing copper diffusion.

Figure 4A:
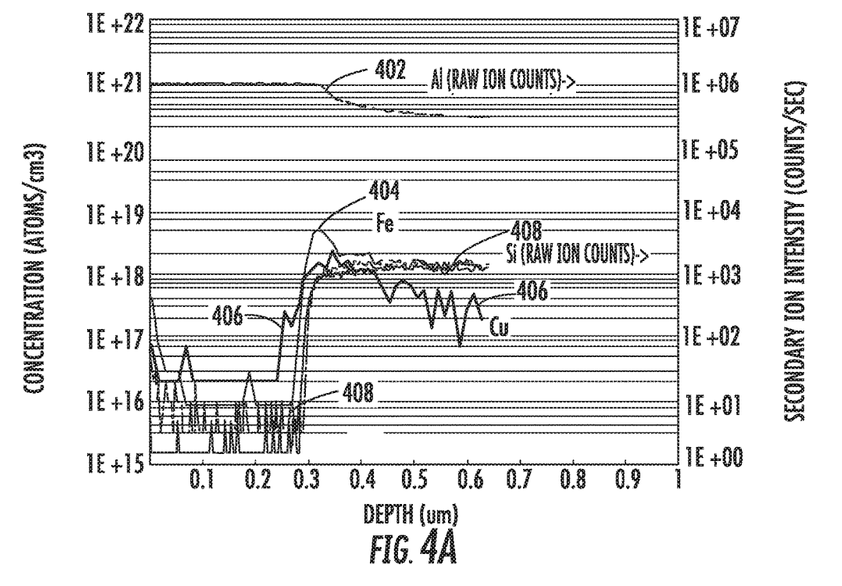
FIG. 4A depicts the results of secondary ion mass spectroscopy analysis of a layer stack.
Figure 4B:
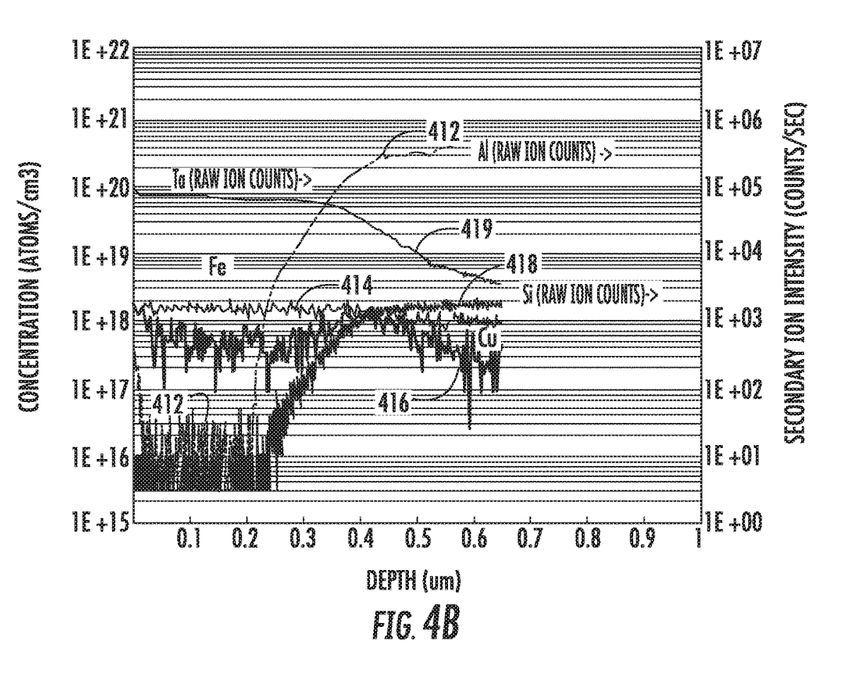
FIG. 4B depicts the results of secondary ion mass spectroscopy analysis of another layer stack.
Figure 4C:
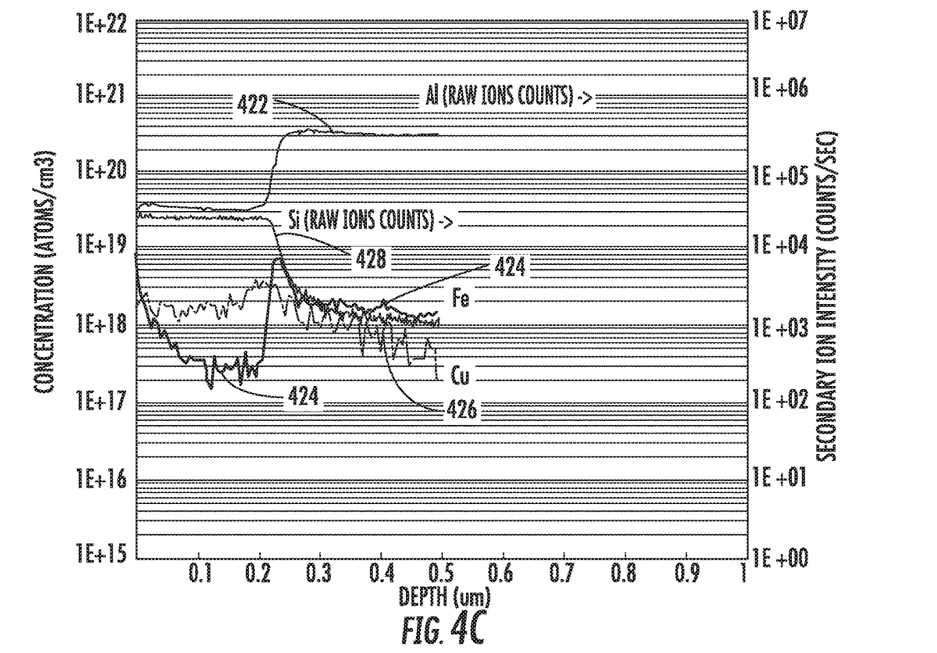
FIG. 4C depicts the results of secondary ion mass spectroscopy analysis of yet another layer stack.
Figure 4D:
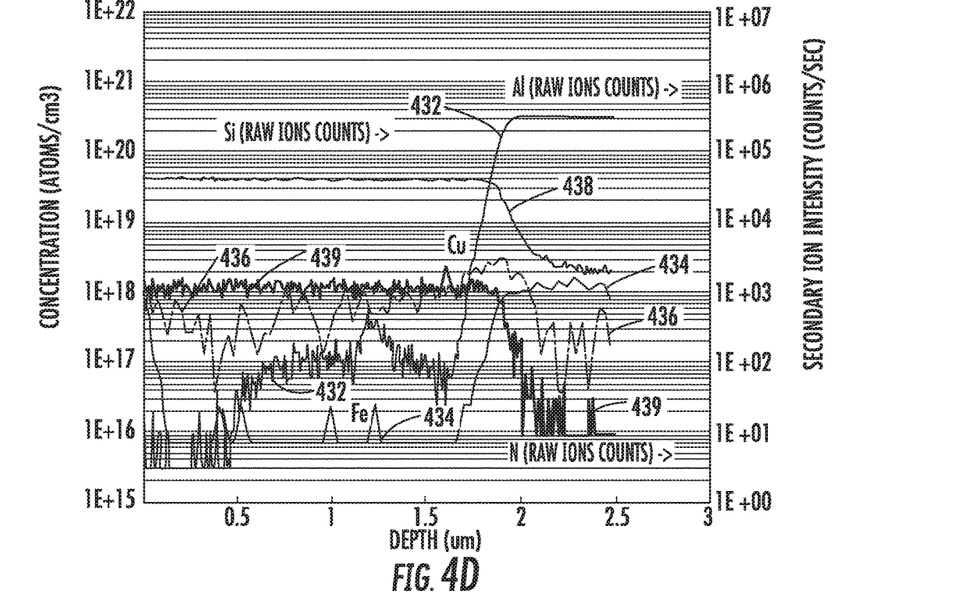
FIG. 4D depicts the results of secondary ion mass spectroscopy analysis of a further layer stack.
Figure 4E:
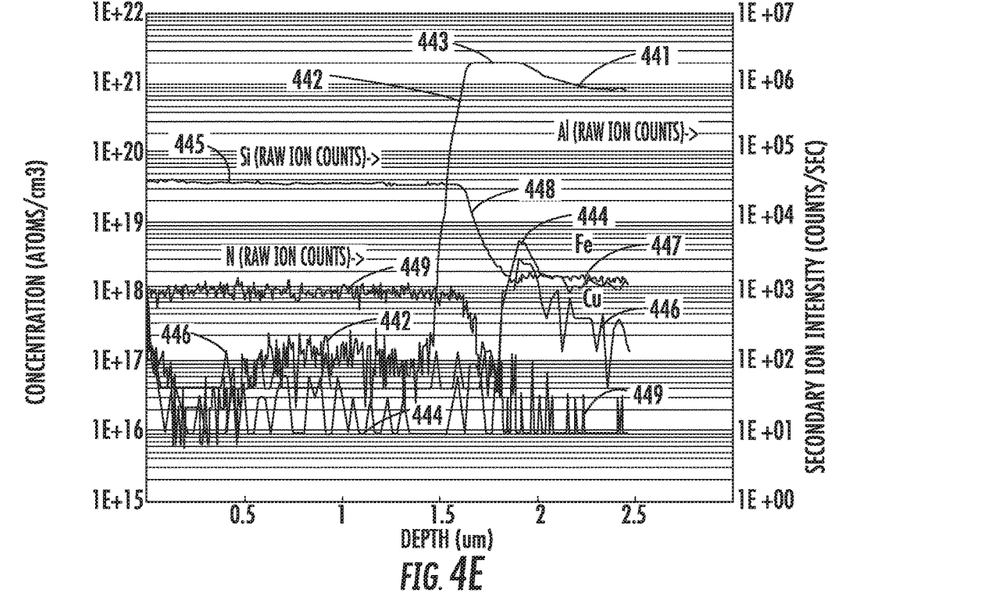
FIG. 4E depicts the results of secondary ion mass spectroscopy analysis of still another layer stack.
Figure 4F:
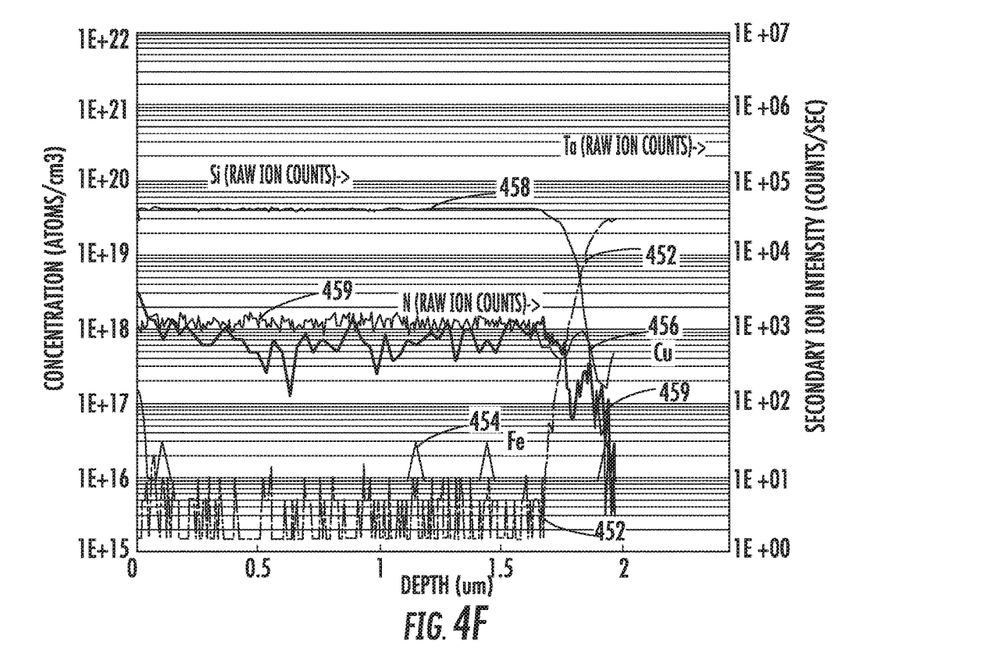
FIG. 4F depicts the results of secondary ion mass spectroscopy analysis of still another layer stack.
Figure 4G:
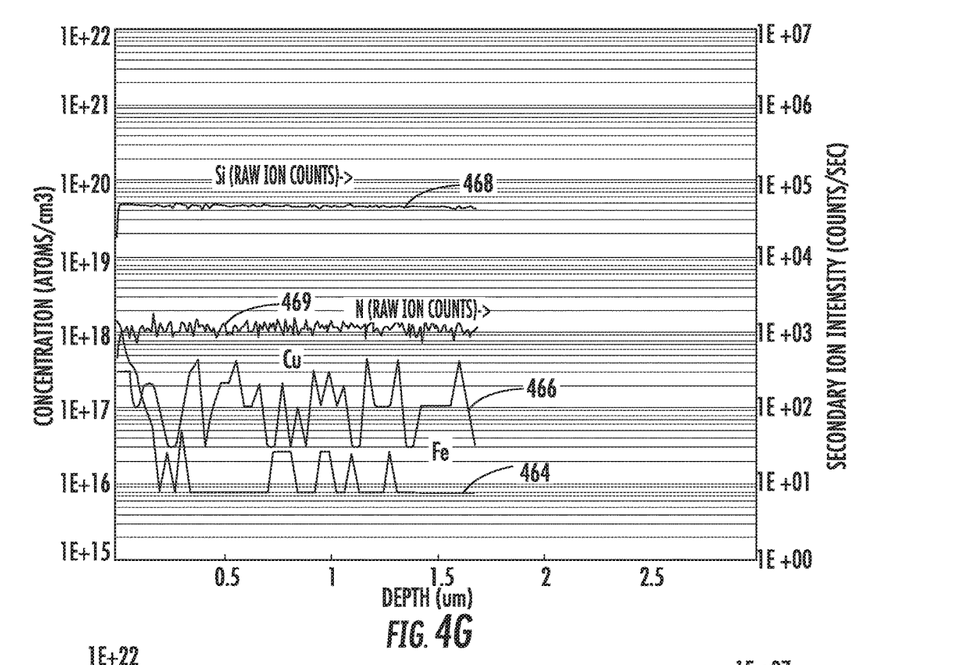
FIG. 4G depicts the results of secondary ion mass spectroscopy analysis of an additional layer stack.
Figure 4H:
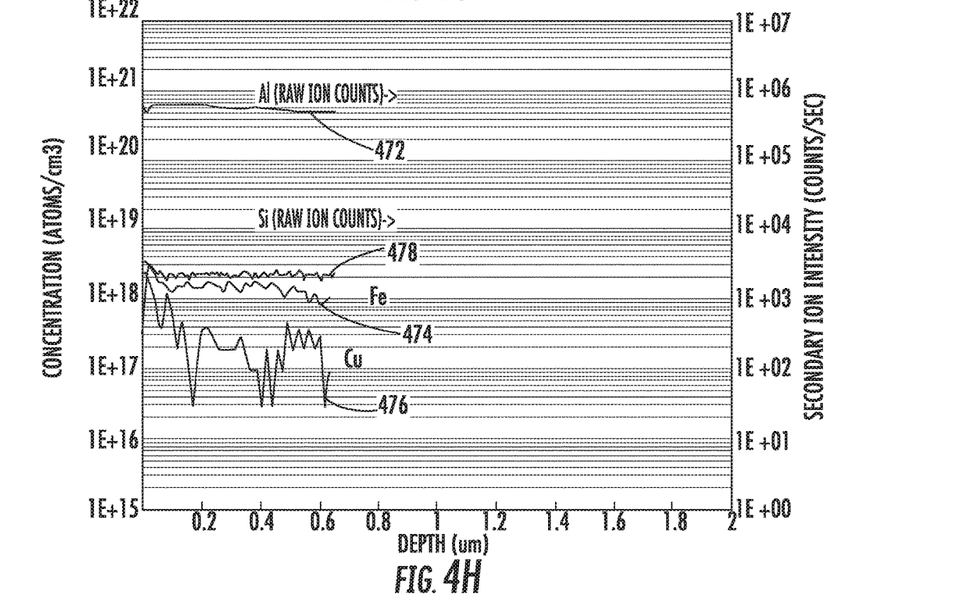
FIG. 4H depicts the results of secondary ion mass spectroscopy analysis of a control sample.

FIG. 4H depicts the results of secondary ion mass spectroscopy analysis of a control (substrate) sample, which indicates the level of copper and iron present in the substrate. This figure indicates the signal levels for silicon (curve 478), aluminum (curve 472), iron (curve 474) and copper (curve 476) in a substrate without any diffusion barrier layer.

Turning to FIG. 4A there is shown the results of secondary ion mass spectroscopy analysis of a layer stack composed of a single 200-300 nm thick layer of $Al_2O_3$ fabricated using ALD, where the aluminum and silicon signal present at a depth greater than 300 nm represent the substrate. As illustrated, both copper and iron diffusion from the glass insulator substrate is prevented. For different elements, the data is plotted as either raw signal counts or as concentration for a given element. In particular, the curve 402 represents aluminum, whose signal level drops at a depth of approximately 0.3 micrometers, indicating an interface between the $Al_2O_3$ layer fabricated using ALD and an underlying glass substrate. The aluminum signal in the underlying glass substrate may indicate the concentration of aluminum in the glass substrate before processing. As also shown, the glass substrate includes silicon (curve 408), copper (curve 406), and iron (curve 404). The copper and iron concentrations in the substrate are in the range of 1 E18 in the substrate, indicating a concentration, which indicates a relative atomic concentration in the ten-parts-per million range of these metallic elements in the substrate. The copper and iron concentrations measured in the region at less than 0.3 micrometers depth represent their respective concentrations within the $Al_2O_3$ layer fabricated using ALD. As illustrated the concentrations for both copper and iron and are in the range of 1 E16, which may correspond to approximate detection limits of these elements, indicating little or no diffusion of copper of iron into the $Al_2O_3$ layer fabricated using ALD.

FIG. 4B depicts the results of secondary ion mass spectroscopy analysis of another layer stack composed of a nominal 200 nm thick layer of $Ta_2O_5$ fabricated using ALD. In this case, copper and iron diffuse through the nominal 200 nm thick layer of $Ta_2O_5$. Curve 419 represents tantalum, whose signal level drops at a depth of approximately 0.3 micrometers, indicating an interface between the $Ta_2O_5$ layer fabricated using ALD and an underlying glass substrate that includes silicon (curve 418), copper (curve 416), iron (curve 414), and aluminum (curve 412). As illustrated, the concentration of copper and iron within the tantalum oxide layer as indicated by the signals when the depth is less than 0.3 micrometers, is approximately the same as the respective concentration of copper and iron in the substrate, as indicated by the signals for depths greater than 0.3 micrometers. This illustrates that the tantalum oxide layer does not suppress copper and iron diffusion from the substrate after processing at 550° C. for 24 hrs.

FIG. 4C depicts the results of secondary ion mass spectroscopy analysis of yet another layer stack which is composed of a single 200 nm thick layer of silicon nitride fabricated by PECVD. In this example, silicon present in the silicon nitride layer is indicated by the curve 428, which drops at a depth of 0.2 micrometers, corresponding to the interface between the silicon nitride layer and substrate. Copper (curve 426) diffuses through the silicon layer as well as iron (curve 424) and to a lesser extent. Aluminum (curve 422) also appears to diffuse into the silicon nitride layer.

FIG. 4D depicts the results of secondary ion mass spectroscopy analysis of a further layer stack which is composed of a single 2 micrometer thick layer of silicon nitride fabricated by PECVD, and indicated by the curve 438 for silicon. In this example, copper diffuses through the barrier layer while iron diffusion is suppressed. Copper (curve 436) diffuses throughout the silicon layer such that the level of copper concentration is approximately the same in the silicon nitride layer as in the substrate. The low level of iron signal (curve 434) in the silicon nitride film at depths less than 2 micrometers shows that iron diffusion is suppressed. A small amount of aluminum (curve 432) also appears to diffuse into at least the lower regions of the silicon nitride layer nearer the substrate.

FIG. 4E depicts the results of secondary ion mass spectroscopy analysis of still another layer stack composed of a nominally 200 nm thick layer of $Al_2O_3$ fabricated using ALD which is indicated by the plateau portion 443 of the aluminum curve 442. This layer is adjacent the substrate, whose position is indicated by the portion 441 of aluminum curve 442 and portion 447 of silicon curve 448. A 2 micrometer thick layer of silicon nitride fabricated by PECVD is disposed on top of the nominally 200 nm thick layer of $Al_2O_3$, as indicated by nitrogen curve 449 and the plateau portion 445 of the silicon curve 448. In this case, copper (curve 446) and iron (curve 444) diffusion are effectively suppressed.

FIG. 4F depicts the results of secondary ion mass spectroscopy analysis of still another layer stack composed a 200 nm thick layer of $Ta_2O_5$ fabricated using ALD, which is indicated by curve 452. A 2 micrometer thick layer of silicon nitride fabricated by PECVD is disposed on top of the nominally 200 nm thick layer of $Ta_2O_5$, as indicated by nitrogen curve 459 and the silicon curve 458. The underlying substrate is not shown. In this case, iron diffusion (curve 454) is suppressed but copper (curve 456) diffuses throughout the layer stack.

FIG. 4G depicts the results of secondary ion mass spectroscopy analysis of an additional layer stack composed of a nominally 200 nm thick layer of $Al_2O_3$ fabricated using ALD, a 200 nm thick layer of $Ta_2O_5$ fabricated using ALD, and a 2 micrometer thick layer of silicon nitride fabricated by PECVD, as indicated by the silicon curve 468 and nitrogen curve 469. The SIMS data is collected to just a depth of 1.7 micrometers, so does not reflect the alumina or tantalum oxide layers that are closer to the substrate. However, it can be seen that copper (curve 466) and iron (curve 464) diffusion are suppressed as evidenced by the low count level in the silicon nitride layer.

Figure 4I:
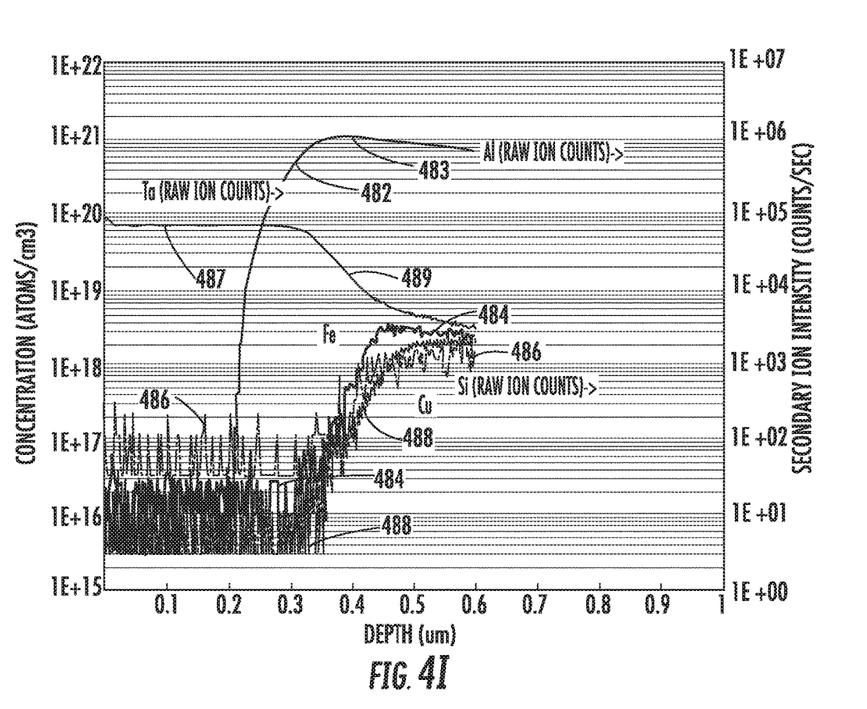
FIG. 4I depicts the results of secondary ion mass spectroscopy analysis of another layer stack.

FIG. 4I depicts the results of secondary ion mass spectroscopy analysis of another layer stack composed of a nominally nm thick layer of $Al_2O_3$ fabricated using ALD, indicated by plateau portion 483 of aluminum curve 482, and a nominally 200 nm thick layer of $Ta_2O_5$ fabricated using ALD, indicated by plateau portion 487 of tantalum curve 489. These layers are disposed on a substrate indicated by silicon curve 488. Once more, copper (curve 486) and iron (curve 484) diffusion is suppressed so that copper and iron do not diffuse into the layer stack.

Figure 5:
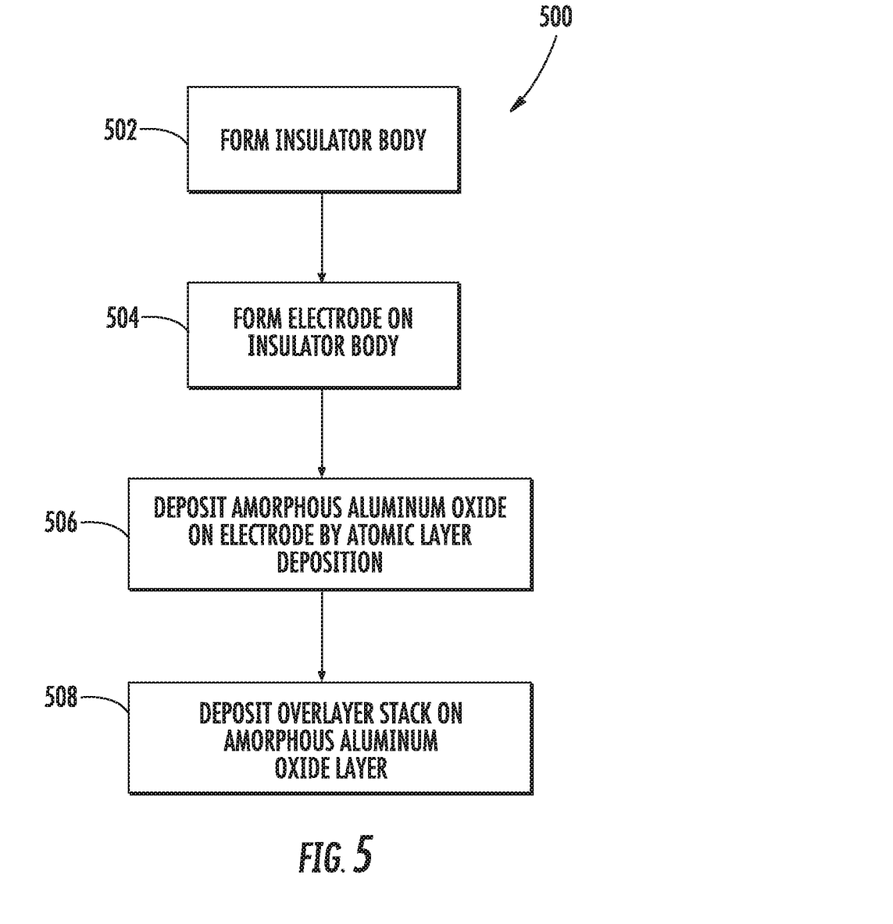
FIG. 5 is an exemplary process flow.

FIG. 5 depicts exemplary operations involved in a process 500 for fabricating an electrostatic clamp according to embodiments of the disclosure. At block 502 an insulator body of the electrostatic clamp is formed. The insulator body may be formed on a base, such as a metallic block. The base may include a heater or may be coupled to a heater that is used to heat the electrostatic clamp. The insulator body may be composed of a ceramic such as alumina in some cases. At block 504 an electrode is formed on the insulator body. The electrode may be composed of a metallic material such as tungsten, molybdenum, or platinum in some examples. The embodiments are not limited in this context. In some variants, the electrode may be multiple electrodes that are arranged on the insulator body. At block 506 an amorphous aluminum oxide layer is deposited by atomic layer deposition on the electrode. The aluminum oxide layer may have a thickness of 500 nm to 10 micrometers in some embodiments. The aluminum oxide layer may be deposited in a conformal manner that encapsulates the electrode(s) as well as exposed portions of the insulator body not covered by the electrode.

At block 508, an overlayer stack is deposited on the amorphous aluminum oxide layer. The overlayer stack may include a single insulator layer such as silicon nitride or aluminum oxy nitride. The overlayer stack may include multiple insulator layers deposited in succession in which each insulator layer differs from a previously deposited insulator layer. In some examples the overlayer stack may have an overall thickness between 40 micrometers and 200 micrometers. The overlayer stack may be prepared by just one deposition process such as chemical vapor deposition, or may be prepared using multiple different deposition processes. For example, an aluminum oxynitride layer that forms a portion of the overlayer stack may be deposited by a physical vapor deposition process while a silicon nitride layer that forms another portion of the overlayer stack is deposited by plasma enhanced chemical vapor deposition.

In one variant of the process 500 the block 508 may be performed before the block 506 such that the overlayer stack is deposited directly on top of an electrode and an aluminum oxide layer is deposited on top of the overlayer stack.

Although the aforementioned embodiments may be deployed for operation of electrostatic clamps at elevated temperatures, such as temperatures of 100° C. to 700° C., for example, it is contemplated that the present embodiments may also suppress unwanted diffusion of species during operation of unheated electrostatic clamps.

In summary, the present embodiments provide improved electrostatic clamps that include a layer of $Al_2O_3$ fabricated using ALD, which is disposed between clamp electrodes and a substrate to be clamped. The layer of $Al_2O_3$ fabricated using ALD may form part of a layer stack of electrically insulating material that has a total thickness of 50 to 200 micrometers in various embodiments. In different embodiments, the layer of $Al_2O_3$ fabricated using ALD may be disposed adjacent clamp electrodes; may be disposed on top of other insulator material, thus forming the outermost layer; or may be disposed within a stack of insulator layers such that an insulator layer is disposed between the $Al_2O_3$ fabricated using ALD and clamp electrodes, and another insulator layer is disposed between the Al$_2$O$_3$ fabricated using ALD and a substrate to be clamped. In addition to providing a diffusion barrier to prevent diffusion of unwanted species from clamp electrodes, insulator layers, or other electrostatic clamp components, the Al$_2$O$_3$ fabricated using ALD may facilitate achieving a target breakdown strength for insulator layers so that the insulator stack does not breakdown when voltage is applied to electrodes during operation of the electrostatic clamp.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An electrostatic clamp, comprising:
an insulator body;
an electrode disposed on the insulator body; and
a layer stack comprising an amorphous aluminum oxide layer having a thickness of 10 micrometers or less and at least one additional insulator layer.

2. The electrostatic clamp of claim 1, wherein the amorphous aluminum oxide layer has a thickness between 500 nm and 10 micrometers.

3. The electrostatic clamp of claim 1, wherein the layer stack has a thickness of between 40 micrometers and 200 micrometers.

4. The electrostatic clamp of claim 3, wherein the layer stack comprises:
an aluminum oxide layer disposed adjacent the electrode; and
at least one additional insulator layer disposed on the aluminum oxide layer.

5. The electrostatic clamp of claim 3, wherein the layer stack comprises at least one additional insulator layer disposed adjacent the electrode, and the aluminum oxide layer disposed on the at least one additional insulator layer.

6. The electrostatic clamp of claim 1 wherein the at least one additional insulator layer comprises at least one aluminum oxynitride layer and at least one silicon nitride layer.

7. The electrostatic clamp of claim 1 wherein the electrode comprises platinum.

8. An electrostatic clamp system, comprising:
an insulator body;
an electrode comprising a metallic material that is disposed on the insulator body;
a layer stack comprising insulating material having a total thickness of less than 100 micrometers, and including an amorphous aluminum oxide layer having a thickness of 10 micrometers or less; and
a heater configured to heat the insulator body, wherein the electrostatic clamp is configured to operate at 500° C. or greater without diffusion of the metallic material through the layer stack.

9. The electrostatic clamp system of claim 8, wherein the layer stack comprises:
an aluminum oxide layer disposed adjacent the electrode having a thickness less than 5 micrometers; and
at least one additional insulator layer disposed on the aluminum oxide layer, wherein the total thickness of the layer stack is greater than 40 micrometers.

10. An electrostatic clamp, comprising:
an insulator body;
an electrode disposed on the insulator body; and
a layer stack disposed on the electrode, the layer stack comprising an aluminum oxide layer formed using atomic layer deposition (ALD) and disposed directly on the electrode, wherein the layer stack further comprises:
a plurality of insulator layers, disposed on the aluminum oxide layer, wherein the plurality of insulator layers comprises a nitride layer and an oxynitride layer.

11. The electrostatic clamp of claim 10,
wherein the aluminum oxide layer comprises a thickness of between 500 nanometers and 10 micrometers.

12. The electrostatic clamp of claim 10, wherein the plurality of insulator layers comprising a thickness of between 40 micrometers and 200 micrometers.

13. The electrostatic clamp of claim 10, wherein the layer stack comprises:
an aluminum oxynitride layer, disposed on the aluminum oxide layer; and
a silicon nitride layer, disposed on the aluminum oxynitride layer.

14. The electrostatic clamp of claim 13, wherein the aluminum oxynitride layer is a first aluminum oxynitride layer, the silicon nitride layer is a first silicon nitride layer, and the first aluminum oxynitride layer and the first silicon nitride layer together constitute a first overlayer stack, the layer stack further comprising:
a second overlayer stack, disposed on the first overlayer stack, the second overlayer stack comprising:
a second aluminum oxynitride layer, disposed directly on the first silicon nitride layer; and
a second silicon nitride layer, disposed on the second aluminum oxynitride layer.

15. The electrostatic clamp of claim 10, wherein the layer stack comprises a thickness of 40 micrometers to 75 micrometers.

16. The electrostatic clamp of claim 10, wherein the aluminum oxide layer comprises an amorphous layer.

17. The electrostatic clamp of claim 10, wherein the electrode is a platinum electrode.

* * * * *